(12) United States Patent
Shih

(10) Patent No.: US 8,792,251 B2
(45) Date of Patent: Jul. 29, 2014

(54) ELECTRONIC DEVICE WITH LOCKING ASSEMBLY

(75) Inventor: Cheng-Feng Shih, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 398 days.

(21) Appl. No.: 13/223,260

(22) Filed: Aug. 31, 2011

(65) Prior Publication Data

US 2012/0327628 A1 Dec. 27, 2012

(51) Int. Cl.
*H05K 7/02* (2006.01)

(52) U.S. Cl.
USPC ........................................................ 361/807

(58) Field of Classification Search
USPC ........................................................ 361/807
See application file for complete search history.

(56) References Cited

U.S. PATENT DOCUMENTS

| | | | | |
|---|---|---|---|---|
| 6,760,460 | B1 * | 7/2004 | Jeon | 381/388 |
| 7,128,514 | B1 * | 10/2006 | Le Beau | 411/433 |
| 7,262,976 | B2 * | 8/2007 | Yu | 361/807 |
| 7,593,240 | B2 * | 9/2009 | Kao | 361/807 |
| 7,729,127 | B2 * | 6/2010 | Yeh et al. | 361/810 |
| 2008/0170375 | A1 * | 7/2008 | Jablonski et al. | 361/760 |
| 2010/0108840 | A1 * | 5/2010 | Oh et al. | 248/229.1 |
| 2011/0261534 | A1 * | 10/2011 | Yang et al. | 361/707 |
| 2012/0182707 | A1 * | 7/2012 | Chen | 361/807 |
| 2012/0320499 | A1 * | 12/2012 | Yang et al. | 361/679.01 |

* cited by examiner

*Primary Examiner* — Forrest M Phillips
(74) *Attorney, Agent, or Firm* — Novak Druce Connolly Bove + Quigg LLP

(57) ABSTRACT

An electronic device includes an enclosure and a locking assembly. The locking assembly includes a fixing sleeve including a fixing end hermetically fixed to the enclosure, and an opening end away from the enclosure, and a locking bracket. The locking bracket is attached to the fixing sleeve and defines a through hole defining a passing portion and at least one locking portion communicating with each other. The electronic device is position to a fastener by the fastener passing through the passing portion and being positioned in the locking portion of the through hole.

20 Claims, 12 Drawing Sheets

ELECTRONIC DEVICE WITH LOCKING ASSEMBLY

BACKGROUND

1. Technical Field

The present disclosure relates to electronic devices, and more particularly to a locking assembly of an electronic device.

2. Description of Related Art

Many electronic devices, such as IP phones, or LCD TVs, are mounted on walls by use of bolts or other fasteners. Generally, these electronic devices are configured with grooves to receive the bolts or fasteners. However, the electronic devices are not always configured with structures to lock or secure the electronic devices to the fasteners. The lack of such structures can lead to potential disengagement of the electronic devices from the fasteners, and correspondingly result in damage to the electronic devices.

Therefore, there is room for improvement within the art.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
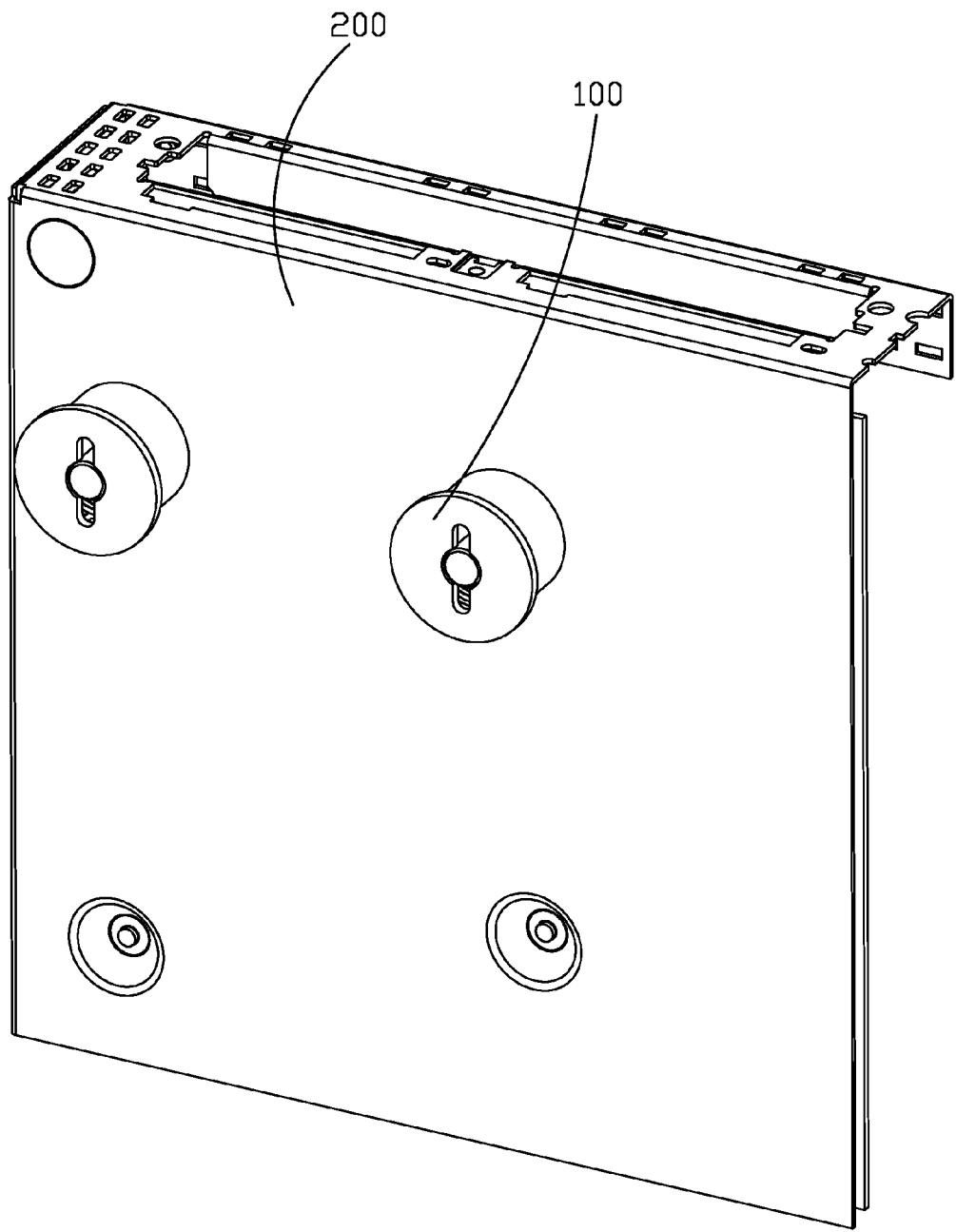
FIG. 1 is an assembled perspective view of an electronic device of an exemplary embodiment of the disclosure.
Figure 2:
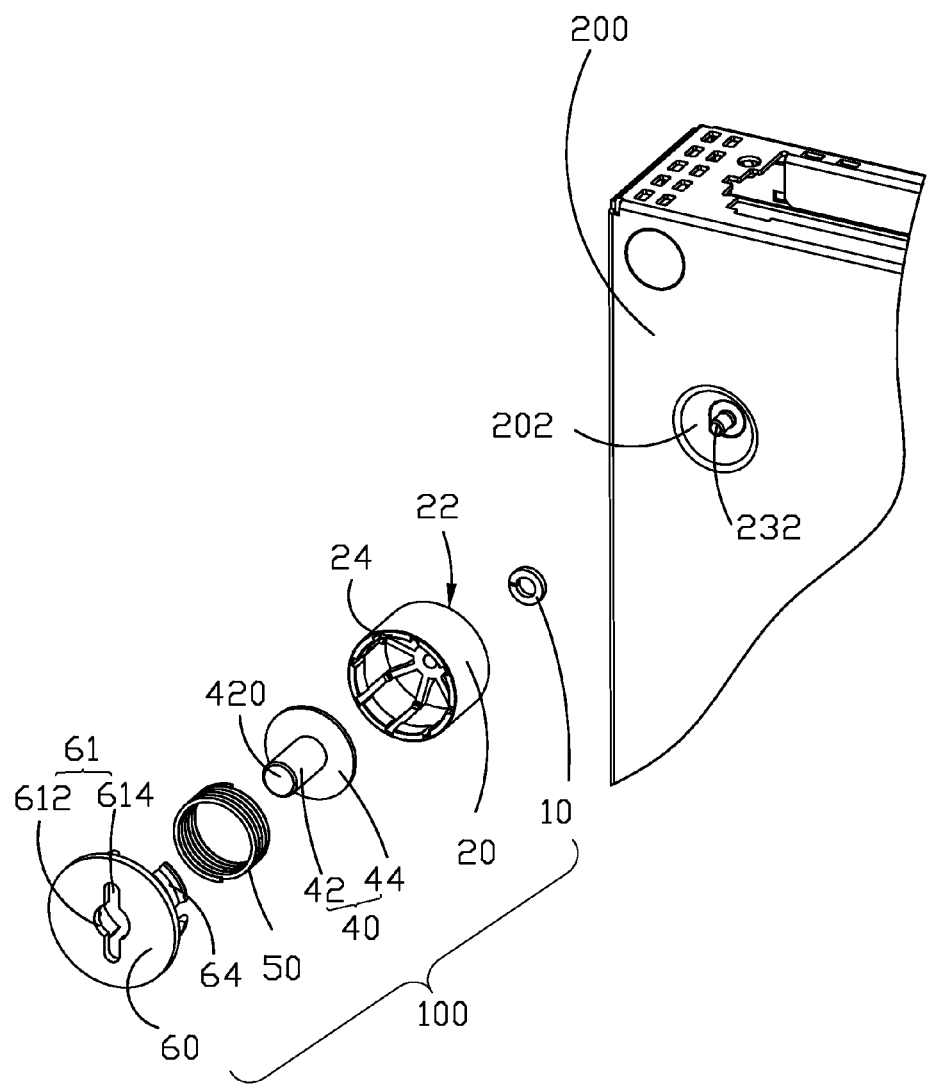
FIG. 2 is an exploded, isometric view of the electronic device of FIG. 1, showing one corner of an enclosure of the electronic device.

Referring to FIGS. 1-2, an electronic device of an exemplary embodiment of the present disclosure is illustrated. The electronic device includes an enclosure 200 and a locking assembly 100 attached to the enclosure 200 to lock the electronic device to a fastener 92 comprising a head 922 and a pole 924 fixed on a wall 90, shown in FIGS. 8-11. The electronic device may be but not limited to a phone, a router, a switch, or an LCD TV, for example. The locking assembly 100 comprises a fixing sleeve 20, a positioning element 40 fixed in the fixing sleeve 20, a locking bracket 60 and a spring 50 urged between the positioning element 40 and the locking bracket 60.

Figure 3:
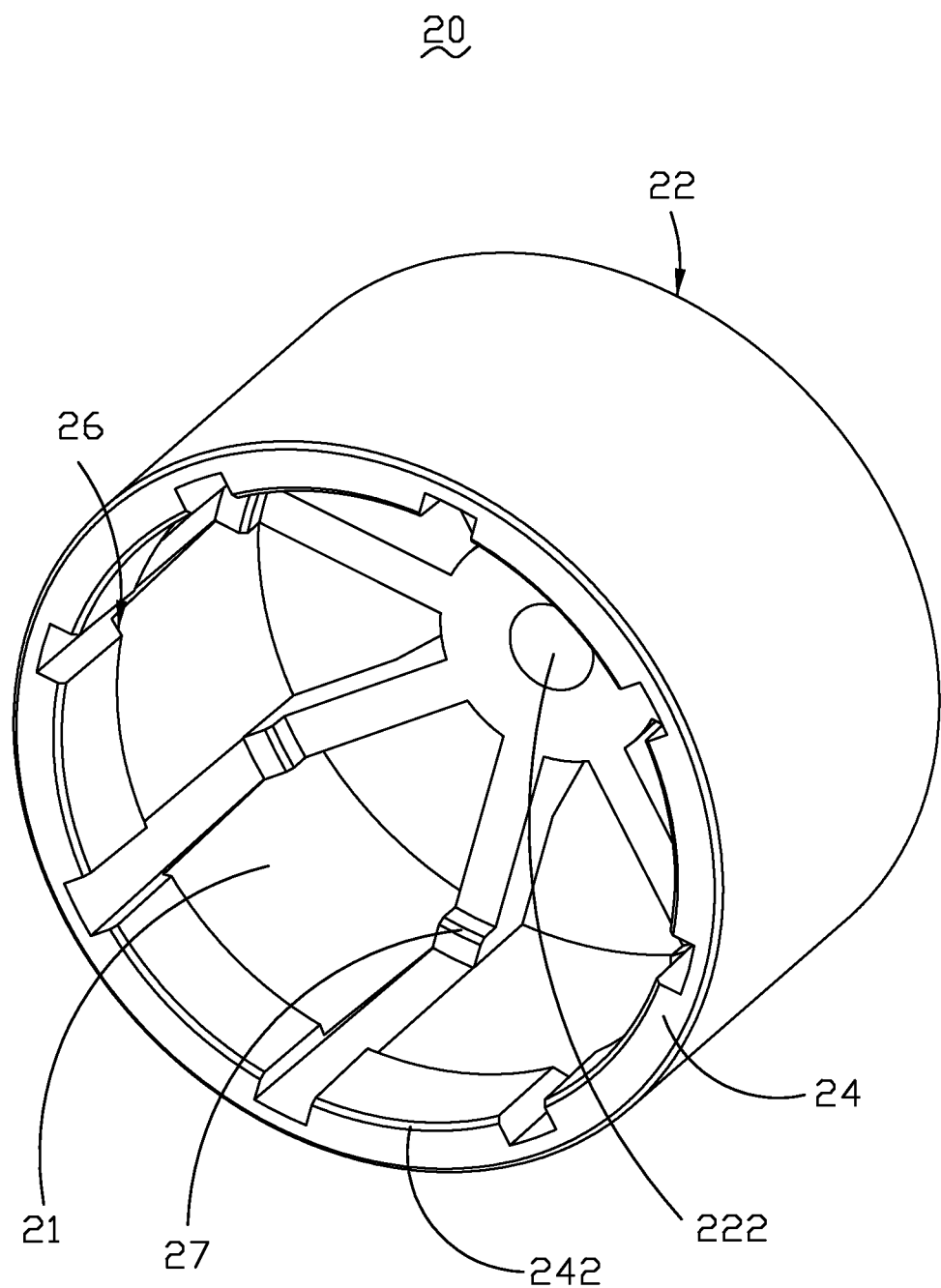
FIG. 3 is a perspective view of a fixing sleeve of the electronic device of FIG. 1.
Figure 4:
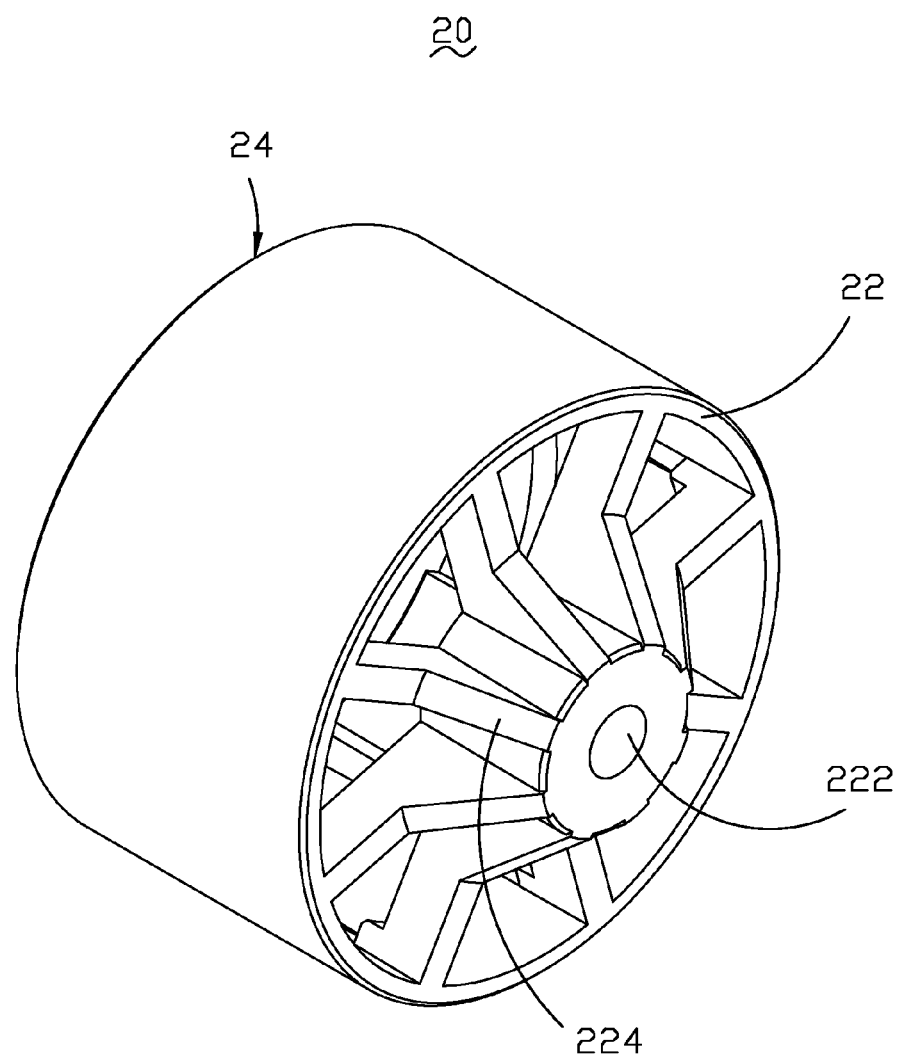
FIG. 4 is a perspective view of the fixing sleeve of FIG. 3, showing from another direction.

Referring to FIGS. 3-4, the fixing sleeve 20 comprises a fixing end 22 hermetically fixed to the enclosure 200, an opening end 24 away from the enclosure 200 and a latching portion 26 extruding inwardly in a circular path. In this embodiment, the latching portion 26 is configured on an inner surface 21 of the fixing sleeve 20 and faces towards the fixing end 22.

Figure 6:
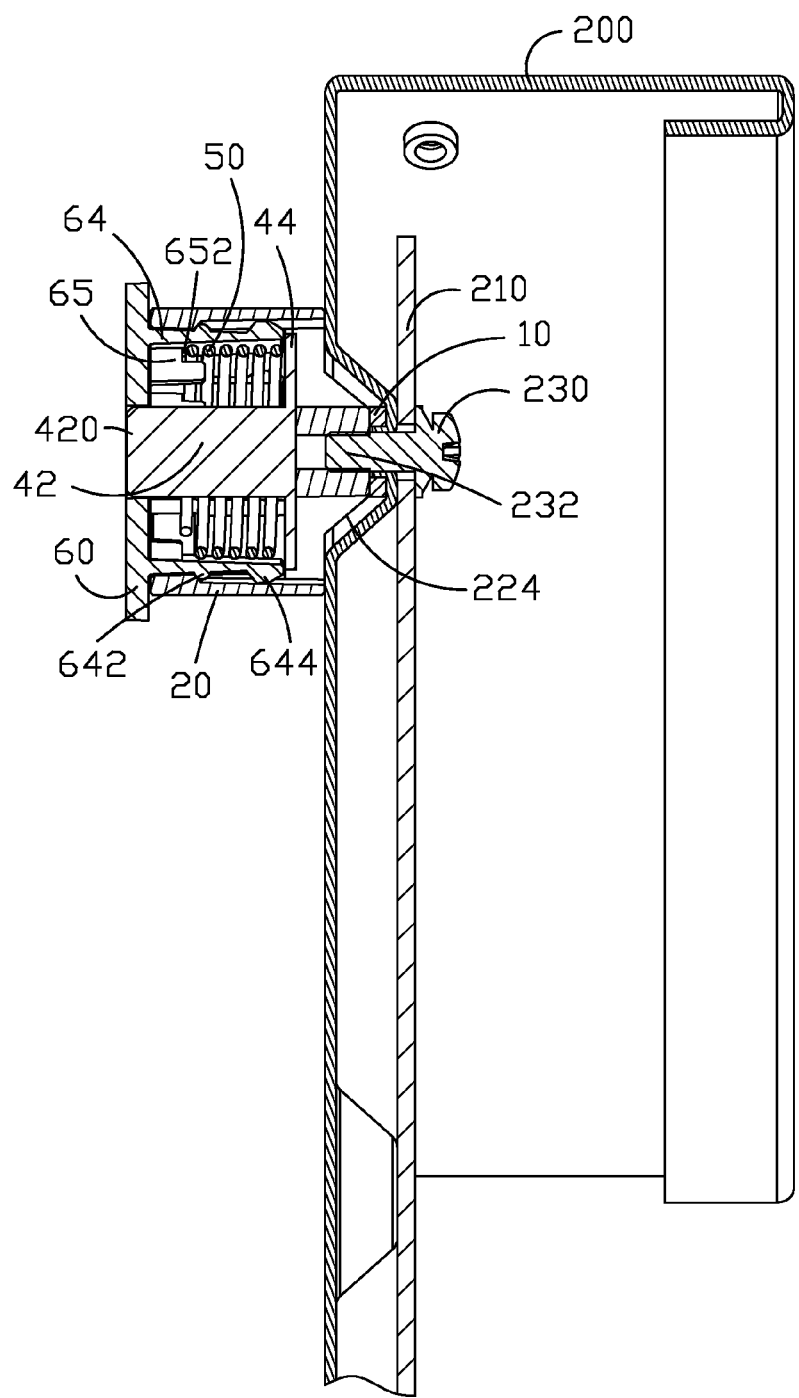
FIG. 6 is a cross section view of the electronic device of FIG. 1, showing the locking bracket in a locked position.

In this embodiment, the fixing end 22 of the fixing sleeve 20 comprises a plurality of protrusions 224 collectively forming a cone-shape structure. A screw hole 222 extending along a center axis of the fixing sleeve 20 is defined in the fixing end 22. The enclosure 200 defines a recess 202 communicating with exterior environment to receive the cone-shape structure formed by the protrusions 224. Referring to FIG. 6, the electronic device comprises a printed circuit board (PCB) 210 fixed in the enclosure 200 by a bolt 230 comprising a screw portion 232 passing through the enclosure 200 at a center of the recess 202 and extending in the recess 202. That is, the screw portion 232 of the bolt 230 passes through the enclosure 200 and screws with the screw hole 222 to fix the fixing end 22 to the enclosure 200. In this embodiment, the locking assembly 100 further comprises a spring washer 10 coiled around the screw portion 232 and mounted between the fixing sleeve 20 and the enclosure 200 to make a secure connection between the fixing sleeve 20 and the enclosure 200. That is, the spring washer 10 resists between the fixing sleeve 20 and the enclosure 200 to prevent the fixing sleeve 20 from disengaging with the screw portion 232.

Figure 5:
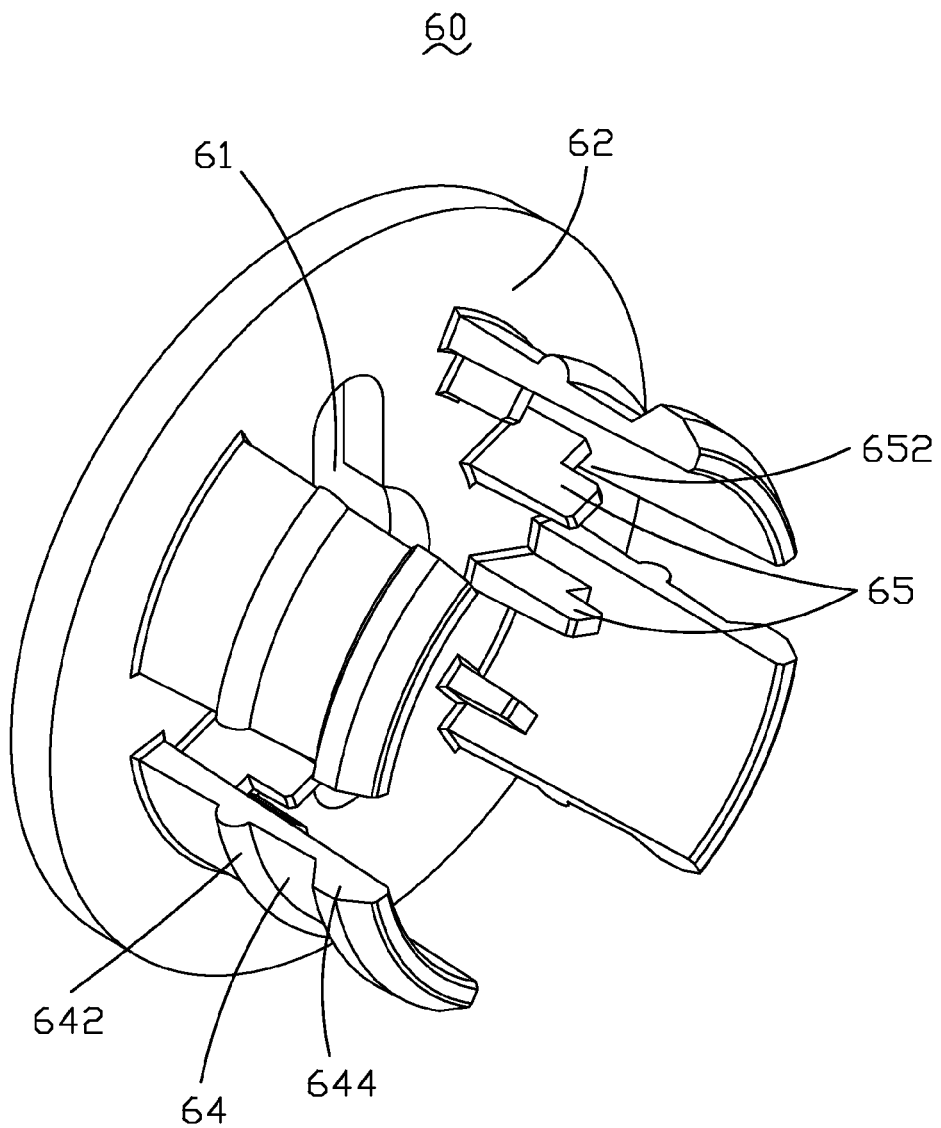
FIG. 5 is a perspective view of a locking bracket of the electronic device of FIG. 3.

Referring to FIG. 5, the locking bracket 60 comprises a body 62 defining a through hole 61 and a plurality of resilient arms 64 perpendicularly extending from the body 62 and surrounding the through hole 61. The through hole 61 defines a passing portion 612 and at least one locking portion 614 communicating with each other. Each of the resilient arms 64 comprises a first projection 642 and a second projection 644 spaced from each other. In the embodiment, the first projections 642 are configured between the body 62 and the second projections 644.

Figure 7:
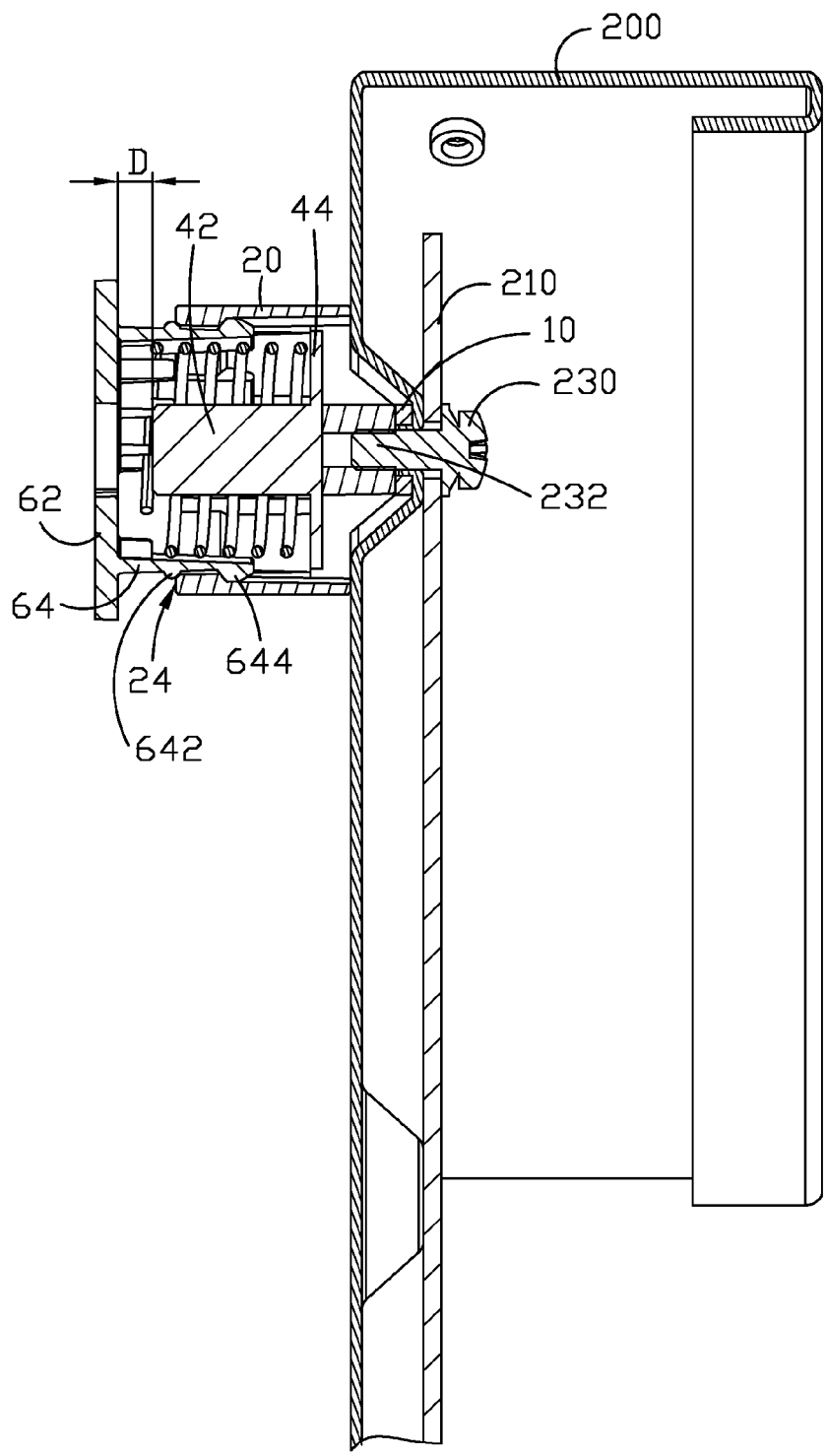
FIG. 7 is a cross section view of the electronic device of FIG. 1, showing the locking bracket in an unlocked position.

Referring to FIGS. 6-7, the lock bracket 60 is mounted to the fixing sleeve 20 with the plurality of resilient arms 64 engage with the fixing sleeve 20, where the second projections 644 firstly engage with the latching portion 26 to allow the fastener 92 to pass through the passing portion 612 and be positioned in the locking portion 614 of the through hole 61, and then the second projections 644 disengage from and the first projections 642 engage with the latching portion 26, and the body 62 of the locking bracket 60 and the positioning element 40 cooperatively prevent the fastener 92 from moving away from the locking portion 614 of the through hole 61 by accident.

The locking assembly 100 is attached to the enclosure 200 by the fixing sleeve 20 screwing with the screw portion 232 passing through the enclosure 200 from inner to exterior. The through hole 61 is defined in the locking bracket 60 and used to lock the electronic device to the fastener 92. Therefore, the enclosure 100 does not have any holes which can be used to provide a waterproofing function for the electronic device.

Figure 12:
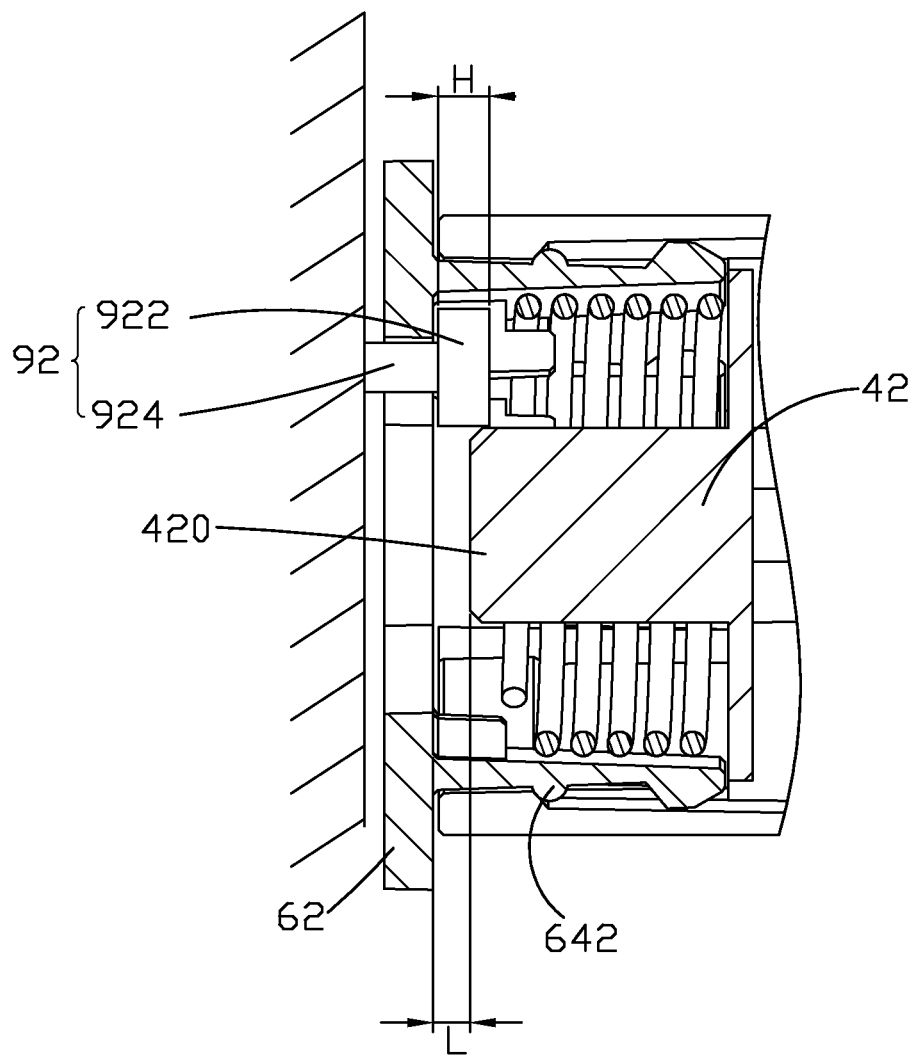
FIG. 12 illustrates the electronic device locked with the fastener in another embodiment.

When the second projections 644 engage with the latching portion 26, a gap D is formed between the positioning element 40 and the body 62 of locking bracket 60 to provide a path for the fastener 92 passing through the passing portion 612 and subsequently position at the locking portion 614. In this embodiment, referring to FIG. 6, when the first projections 642 engage with the latching portion 26, the positioning element 40 engages with the passing portion 612 of the through hole 61 and blocks the fastener 92 from moving away the locking portion 614. In other embodiments, referring to FIG. 12, when the first projections 642 engage with the latching portion 26, a distance L between the positioning element 40 and the body 62 is less than a thickness H of the head portion 922 so that the free end 420 of the positioning pole 42 blocks the fastener 92 from moving away from the locking portion 614.

The positioning element 40 comprises a positioning pole 42 and a positioning base 44 perpendicularly extending from the positioning pole 42 and attached to the fixing end 22 of the fixing sleeve 20. The positioning pole 42 axially extends in the fixing sleeve 20 and comprises a free end 420 extending out from the opening end 24 of the fixing sleeve 20. When the first projections 642 engage with the latching portion 26, the free end 420 of the positioning pole 42 is received in the passing portion 612 of the through hole 61. The spring 50 is resisted between the positioning base 44 of the positioning element 40 and the body 62 of the locking bracket 60.

In this embodiment, when the second projections 644 of the resilient arms 64 engage with the latching portion 26 of the fixing sleeve 20, the first projections 642 engage an inner edge 242 of the opening end 24 of the fixing sleeve 20 to securely position the locking bracket 60 to the fixing sleeve 20.

In this embodiment, the locking bracket 60 comprises a plurality of steps 65 surrounded by the plurality of resilient arms 64. The plurality of steps 65 and the plurality of resilient arms 64 collectively define a plurality of receiving grooves 652 to position the spring 50. One end the spring 50 is received in the plurality of receiving grooves 652, and the other end of the spring 50 resists on the positioning base 44, so as to position the positioning element 40 to the fixing end 22 of the fixing sleeve 20 by elasticity of the spring 50. The fixing sleeve 20 comprises a plurality of positioning blocks 27 protruding inwardly from the inner surface 21 of the fixing sleeve 20, close to the fixing end 22 and cooperatively positioning the positioning base 44, thereby the positioning element 40 being failed to move in the fixing sleeve 20.

Figure 8:
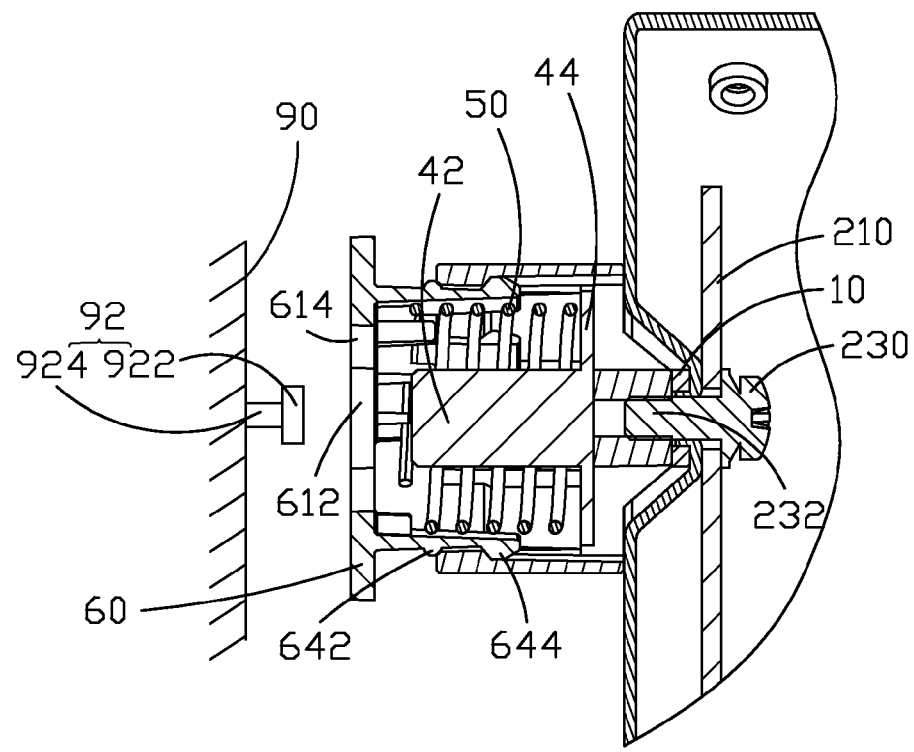
FIG. 8 is a schematic view showing the electronic device of FIG. 7 away from a fastener fixed in a wall.
Figure 9:
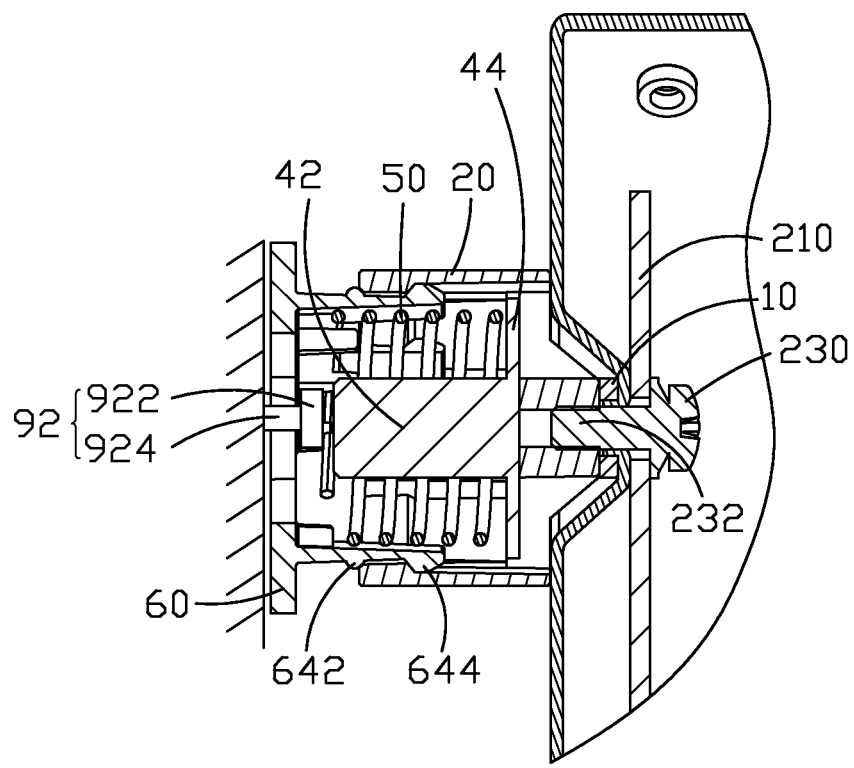
FIG. 9 illustrates a head of the fastener passing through the locking bracket of FIG. 8.
Figure 10:
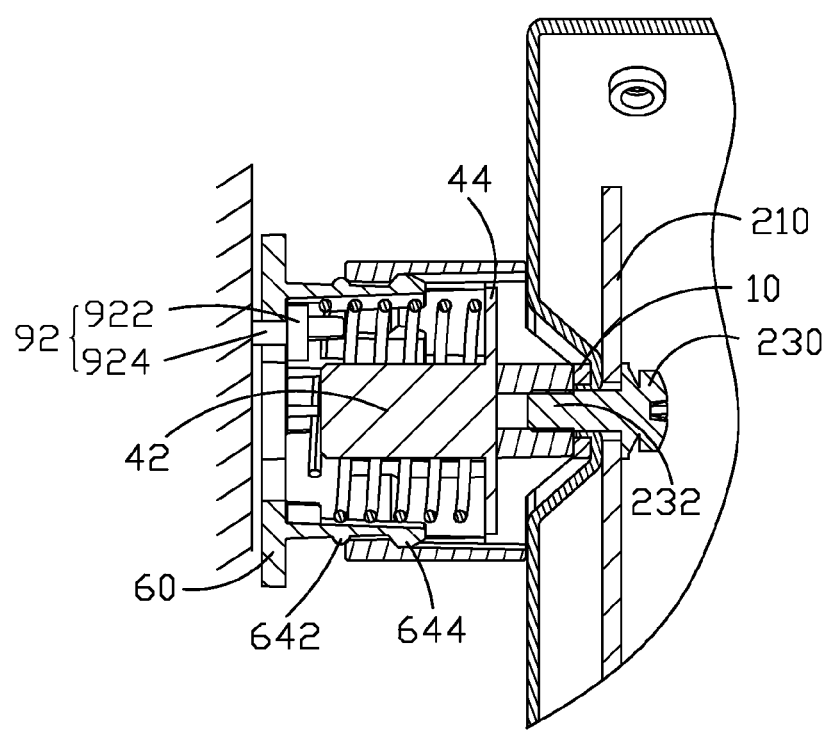
FIG. 10 illustrates the head of the fastener positioned at a locking portion of a through hole defined in the locking bracket.
Figure 11:
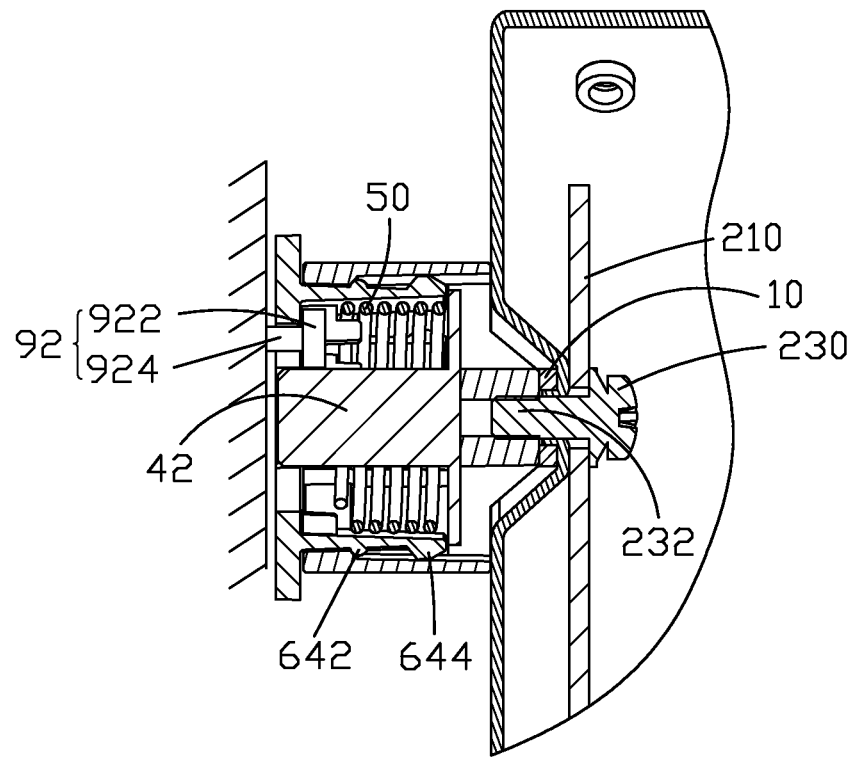
FIG. 11 illustrates the electronic device of FIG. 10 locked with the fastener.

FIGS. 8-11 are schematic views illustrating the electronic device fixed to the fastener 92. Referring to FIG. 8, the locking bracket 60 is pulled out relative to the fixing sleeve 20 to make the second protrusions 644 engage with the latching portion 26 of the fixing sleeve 20, in this position, the passing portion 612 of the through hole 61 of the locking bracket 60 faces toward and is aligned with the head 922 of the fastener 92. Referring to FIG. 9, the head 922 of the fastener 92 pass through the passing portion 612 and is received in the locking assembly 100. Referring to FIG. 10, the electronic device is moved to make the head 922 of the fastener 92 arrive at the locking portion 614 of the through hole 61. Referring to FIG. 11, the electronic device is pushed to make the first protrusions 642 of the resilient arms 64 of the locking bracket 60 engage with the latching portion 26 of the fixing sleeve 20, in this position, the free end 420 of the positioning pole 42 of the positioning element 40 is received in the passing portion 612 of the through hole 61, thereby the electronic device being locked with the fastener 92.

In summary, the fastener 92 is positioned at the locking portion 614 by way of the passing portion 612 of the through hole 61 of the first receiving hole 12, the free end 420 of positioning pole 42 blocks the passing portion 612 to prevent the head 922 of the fastener 92 from moving away the locking portion 614, thereby securely mounting the electronic device to the fastener 92.

The locking bracket 60 can rotate relatively to the fixing sleeve 20 freely, therefore, an angle between the through hole 61 and the electronic device can be adjusted in assembly. In this embodiment, the through hole 61 defines two locking portions 614 symmetrically arranged on two opposite sides of the passing portion 612, and the two locking portions 614 can be designed with different sizes to match various fasteners 92.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:

1. An electronic device, comprising:
an enclosure; and
a locking assembly, comprising:
a fixing sleeve, comprising a latching portion on an inner surface of the fixing sleeve and extending radially inwardly along a circular path, a fixing end hermetically fixed to the enclosure, and an opening end opposite from the fixing end; and
a locking bracket, attached to the opening end of the fixing sleeve and engaged with the latching portion of the fixing sleeve, comprising a body, defining a through hole comprising a passing portion and at least one locking portion communicating with each other and a plurality of resilient arms perpendicularly extending from the body and surrounding the through hole;
wherein the electronic device is attached to a fastener by the fastener passing through the passing portion and being positioned in the locking portion of the through hole.

2. The electronic device as recited in claim 1, wherein the locking bracket further comprises a plurality of steps surrounded by the plurality of the resilient arms, the plurality of steps and the plurality of the resilient arms collectively define a plurality of receiving grooves to position the spring.

3. The electronic device as recited in claim 1, wherein the latching portion faces toward the fixing end of the fixing sleeve.

4. The electronic device as recited in claim 3, wherein the through hole comprises two locking portions of different sizes symmetrically arranged on two opposite sides of the passing portion.

5. The electronic device as recited in claim 1, wherein each of the resilient arms comprises a first projection and a second projection spaced from each other and respectively engaging with the latching portion to movably mount the locking bracket to the fixing sleeve.

6. The electronic device as recited in claim 5, wherein when the second projections of the resilient arms engage with the latching portion of the fixing sleeve, the first projections engage an inner edge of the opening end of the fixing sleeve.

7. The electronic device as recited in claim 5, wherein the locking assembly comprises a positioning element fixed in the fixing sleeve and engaging with the locking bracket to prevent the fastener from moving away from the locking portion of the through hole.

8. The electronic device as recited in claim 7, wherein when the locking bracket is mounted to the fixing sleeve, the second projections firstly engage with the latching portion to allow the fastener to pass through the passing portion and be positioned in the locking portion of the through hole, and then the second projections disengage from and the first projections engage with the latching portion, and the body of the locking bracket and the positioning element cooperatively prevent the fastener from moving away from the locking portion of the through hole.

9. The electronic device as recited in claim 7, wherein when the fastener is attached to the through hole with the first projections engaging with the latching portion, a distance between the positioning element and the body is less than a thickness of a head portion of the fastener.

10. The electronic device as recited in claim 7, wherein the positioning element comprises a positioning pole axially extending in the fixing sleeve and comprising a free end extending out from the opening end of the fixing sleeve, wherein when the first projections engage with the latching portion, the free end of the positioning pole is received in the passing portion of the through hole.

11. The electronic device as recited in claim 10, wherein the locking assembly further comprises a spring received in the fixing sleeve and urged between the positioning element and the body of the locking bracket.

12. The electronic device as recited in claim 11, wherein the positioning element comprises a positioning base, on which the spring resist, perpendicularly extending from the positioning pole and attached to the fixing end of the fixing sleeve by elasticity of the spring.

13. The electronic device as recited in claim 12, wherein the fixing sleeve comprises a plurality of positioning blocks protruding inwardly from an inner surface of the fixing sleeve, close to the fixing end and cooperatively positioning the positioning base.

14. The electronic device as recited in claim 1, wherein the fixing end of the fixing sleeve defines a screw hole, a bolt passes through the enclosure and screwes with the screw hole.

15. The electronic device as recited in claim 14, wherein the locking assembly further comprises a spring washer coiled around the screw portion of the bolt and mounted between the fixing sleeve and the enclosure.

16. The electronic device as recited in claim 14, wherein the fixing end of the fixing sleeve comprises a plurality of protrusions collectively forming a cone-shaped structure, the enclosure defines a recess communicating with exterior environment to receive the cone-shaped structure formed by the protrusions.

17. A locking assembly attached to an enclosure of an electronic device to lock the electronic device to a fastener fixed on a wall, the locking assembly comprising:
a fixing sleeve, comprising a latching portion on an inner surface of the fixing sleeve and extending radially inwardly along a circular path, a fixing end hermetically fixed to the enclosure, and an opening end opposite from the fixing end; and
a locking bracket, attached to the opening end of the fixing sleeve and engaged with the latching portion of the fixing sleeve, comprising a body, defining a through hole comprising a passing portion and at least one locking portion communicating with each other and a plurality resilient arms perpendicularly extending from the body and surrounding the through hole;
wherein each of the resilient arm comprises a first projection and a second projection spaced from each other, and the first projections and the second projections respectively engage with the latching portion to movably mount the locking bracket to the fixing sleeve;
wherein the electronic device is attached to a fastener by the fastener passing through the passing portion and being positioned in the locking portion of the through hole.

18. The locking assembly as recited in claim 17, wherein the locking bracket is movably attached to the fixing sleeve, the locking assembly further comprises a positioning element fixed in the fixing sleeve and engaged with the locking bracket to prevent the fastener from moving away from the locking portion of the through hole.

19. The locking assembly as recited in claim 17, wherein the positioning element comprising a positioning pole axially extending in the fixing sleeve and comprising a free end extending out from the opening end of the fixing sleeve, wherein when the first projections engage with the latching portion, the free end of the positioning pole is received in the passing portion of the through hole.

20. A locking assembly, comprising:
a fixing sleeve, comprising a latching portion on an inner surface of the fixing sleeve and extending radially inwardly along a circular path, a fixing end and an opening end;
a locking bracket, attached to the opening end of the fixing sleeve and engaged with the latching portion of the fixing sleeve, comprising a body, defining a through hole comprising a passing portion and at least one locking portion communicating with each other and a plurality resilient arms perpendicularly extending from the body and surrounding the through hole; and
a positioning element, comprising a positioning pole axially extending in the fixing sleeve and comprising a free end extending out from the opening end of the fixing sleeve;
wherein when the locking bracket engage with the latching portion of the fixing sleeve, the free end of the positioning pole of the positioning element is received in the passing portion of the through hole to prevent the fastener from moving away from the locking portion of the through hole.

* * * * *